United States Patent [19]
Lee et al.

[11] Patent Number: 5,177,450
[45] Date of Patent: Jan. 5, 1993

[54] CMOS POWER AMPLIFIER

[75] Inventors: Bangwon Lee, Kyunggi; Ylsung Bae, Seoul, both of Rep. of Korea

[73] Assignee: Samsung Electronics Co., ltd., Kyunggi, Rep. of Korea

[21] Appl. No.: 771,657

[22] Filed: Oct. 4, 1991

[30] Foreign Application Priority Data

Nov. 27, 1990 [KR] Rep. of Korea .................... 90-19296

[51] Int. Cl.[5] .............................................. H03F 3/45
[52] U.S. Cl. .................................. 330/253; 330/255; 330/257; 330/295
[58] Field of Search .................... 330/124 R, 253, 255, 330/257, 295

[56] References Cited

U.S. PATENT DOCUMENTS 4,480,230 10/1984 Brehmer .............................. 330/255
4,794,349 12/1988 Senderowicz et al. ............. 330/253

Primary Examiner—James B. Mullins
Attorney, Agent, or Firm—Christie, Parker & Hale

[57] ABSTRACT

A CMOS power amplifier is disclosed having a differential input amplifying stage for amplifying differential input signals, a high-gain amplifying stage, and an output stage. The high-gain amplifying stage includes a first amplifying section and a second amplifying section. The first amplifying section drives a first output section of the output stage when the voltage difference between the two inputs of the differential input amplifying stage exceeds a certain voltage value. The second amplifying section drives a second output section of the output stage when the voltage difference between the two inputs is below a certain voltage value. The output stage includes a first output section and a second output section, and the first output section consists of plural pairs of transistors for receiving the output signals of the first amplifying section of the high-gain amplifying stage, and serves as a class B push-pull amplifier. The second output section has pairs of transistors for receiving output signals of the second amplifying section of the high-gain amplifying stage to their gates, and serves as a class AB push-pull amplifier. According to the present invention, DC operating point current is decreased, and an output power equal to the supply voltage swing is produced to a low-impedance load at low current.

9 Claims, 4 Drawing Sheets

CMOS POWER AMPLIFIER

FIELD OF THE INVENTION

The present invention generally relates to CMOS power amplifiers, and particularly relates to CMOS power amplifiers having push-pull structure in which an output voltage equivalent to the power source voltage is produced even under a low DC operating current and under a low impedance load.

BACKGROUND OF THE INVENTION

Arithmetic amplifiers are extensively used in order to amplify signals in all kinds of circuits. When many such arithmetic amplifiers are concentrated in high density applications, power amplifiers are required which are capable of driving a load using a low DC operating current and a low impedance value.

As the density of semiconductor integrated circuits increases, multiple high-density analog circuits and digital circuits are formed through a single process within a single chip. Analog circuits made using CMOS manufacturing techniques are used in various applications, such as vocal band-pass filters, analog-digital converters, and digital-analog converters.

Three types of power amplifiers are well known in the art and are commonly known as types A, B and AB. In a type A amplifier, the collector current of the output stage is continuously conducting, imposing a constant drain on the power source. When a low-impedance load is driven, output transistors of class A amplifiers must have high power ratings since considerable current and power is developed across the transistor.

In a conventional class B push-pull transistor-pair amplifier, conduction is not maintained over the complete output cycle. Class AB amplifiers are a hybrid of types A and B.

Class A output stages and class AB output stages are limited in their output voltage swings, as is known in the art. Therefore, when a low impedance load is driven, the transistors of the output stage must be large in size. Conventional class B output stages have the advantage that output voltage swing is higher than comparable class A and class AB output stages. But Class B amps have the disadvantages that crossover distortion is increased, and that control of DC operating current becomes difficult. These disadvantages render known Class A, B and AB amplifiers unsuited to CMOS applications requiring the amplifier to drive a low-impedance load at low DC operating current.

SUMMARY OF THE INVENTION

The present invention is intended to overcome the above-described disadvantages of conventional amplifier circuits.

An embodiment of the present invention is a CMOS power amplifier having a push-pull structure which is capable of producing output power equivalent to the power source voltage, even when a low impedance load is driven.

A CMOS power amplifier according to one embodiment of the present invention has a differential input amplifying stage for amplifying differential input signals. A high gain amplifying stage increases gain of the output signals of the differential input amplifying stage. An output stage drives a low-impedance load from the output signals of the high-gain amplifying stage.

Preferably, the high-gain amplifying stage includes a first amplifying section for driving a first section of the output stage, if the voltage difference between two inputs to the differential input amplifying stage exceeds a certain value. Also, a second amplifying section drives difference between the two inputs is below a certain value.

Preferably, the output stage includes a first output section comprising of a first pair of transistors, having gates which receive output signals of the first amplifying section of the high-gain amplifying stage, and functions as a class B push-pull amplifier and a second output section consisting of a second pair of transistors having gates which receive output signals of the second amplifying section of the high-gain amplifying stage and functioning as a class AB push-pull amplifier. The transistors emit output signals through drains.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION

In the following detailed description of the preferred embodiments, specific technical terms are used for the sake of clarity. However, the invention is not limited to the specific terms selected, but rather the scope of the invention should be defined with reference to the appended claims.

Figure 1A:
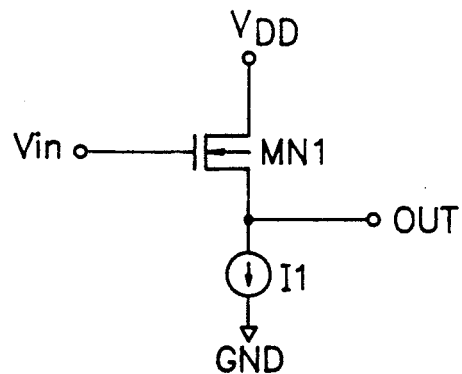
FIGS. 1A, 1B, and 1C are schematic circuit diagrams of three conventional power amplifier output stages.
Figure 1B:
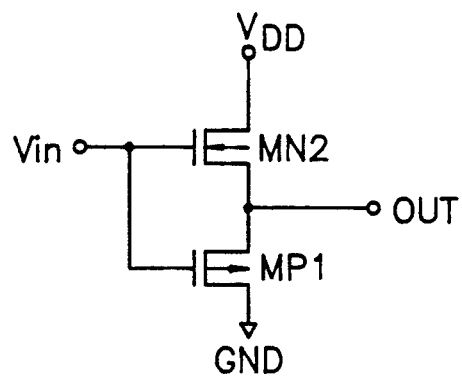
Figure 1C:
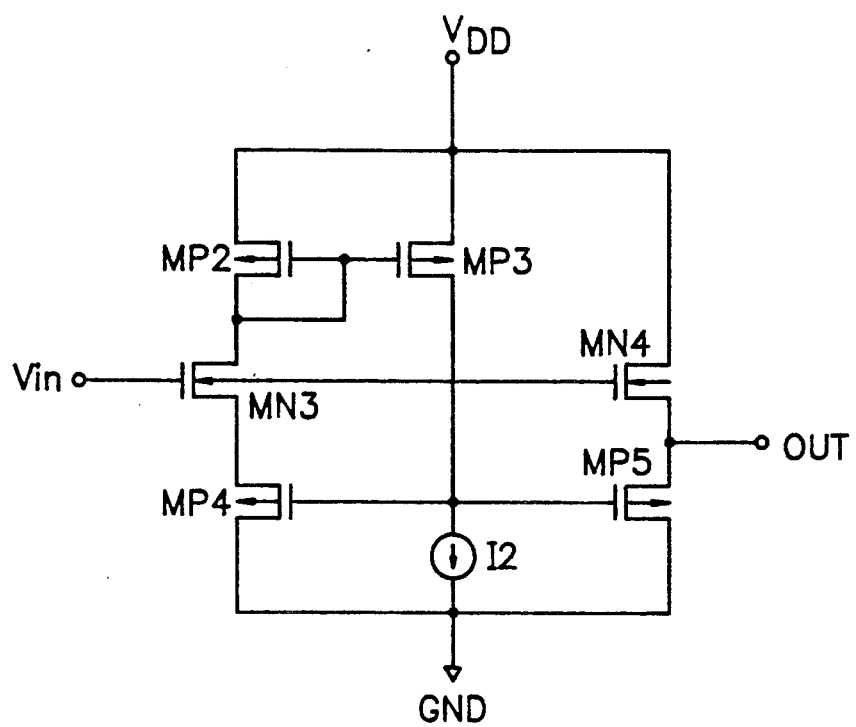

Attention is first invited to FIGS. 1A to 1C which illustrate conventional output stage circuits. Specifically, FIG. 1A is a circuit diagram of a conventional output stage of class A, FIG. 1B is a circuit diagram of a conventional output stage of class B, and FIG. 1C is a circuit diagram of a conventional output stage of class AB.

The class A output stage of FIG. 1A includes an N-type MOS transistor MNI, with its gate connected to and receiving input signals Vin, and a current source I1 connected to the source of transistor MN1.

The class B output stage of FIG. 1B includes two CMOS transistors, specifically a P type MOS transistor MP1 and an N type MOS transistor MN2, with their gates receiving input signals Vin.

The class AB output stage of FIG. 1C includes a pair of current mirror transistors MP2, MP3; a pair of transistors MN3, MN4 receiving input signals Vin through their gates; and a pair of transistors MP4, MP5 with their gates connected to the drain of transistor MP3 and to a current source I2.

In the conventional output stages described above, the class A output stage of FIG. 1A and the class AB output stage of FIG. 1C are limited in output voltage swing due to known inherent limitations of these circuit arrangements. Therefore, when a load having a low impedance value is driven by a Class A or AB circuit, the transistor used in the output stage must be large in size.

Meanwhile, a conventional class B output stage of FIG. 1B has the advantage that its output voltage swing is higher, compared with class A and class AB output stages, but has two disadvantages: the crossover distortion is increased; and control of the DC operating point current is difficult.

To overcome these disadvantages, U.S. Pat. No. 4,480,230 discloses a CMOS class AB power amplifier. However, in the amplifier of the '230 patent, since the high gain amplifying stage and the output stage are formed together, crossover distortion is a significant problem.

To overcome these disadvantages, an amplifier embodying the present invention may be used. Attention is first invited to FIG. 2, which illustrates a CMOS power amplifier 1 according to the present invention having a differential input amplifying stage 10 for amplifying differential input signals received on lines S2, S4; a high gain amplifying stage 20 for increasing the gain of signals amplified by stage 10 received on lines S11 to S14; and an output stage 30 for driving a load (not shown) from output signals S21–S23 from stage 20. Amplifying stage 20 includes separate first and second amplifying sections 21 and 22. The sections 21, 22 each receive input from input stage 10 on lines S11 to S14. Section 21 feeds its output S21–22 to a first output section 31 of output stage 30. Similarly, section 22 feeds its output S23 to a second output section 32 of output stage 30. Stage 30 produces a signal on output line OUT connected to a load.

In FIGS. 2 to 6, like parts are identified with like reference numerals.

Figure 2:
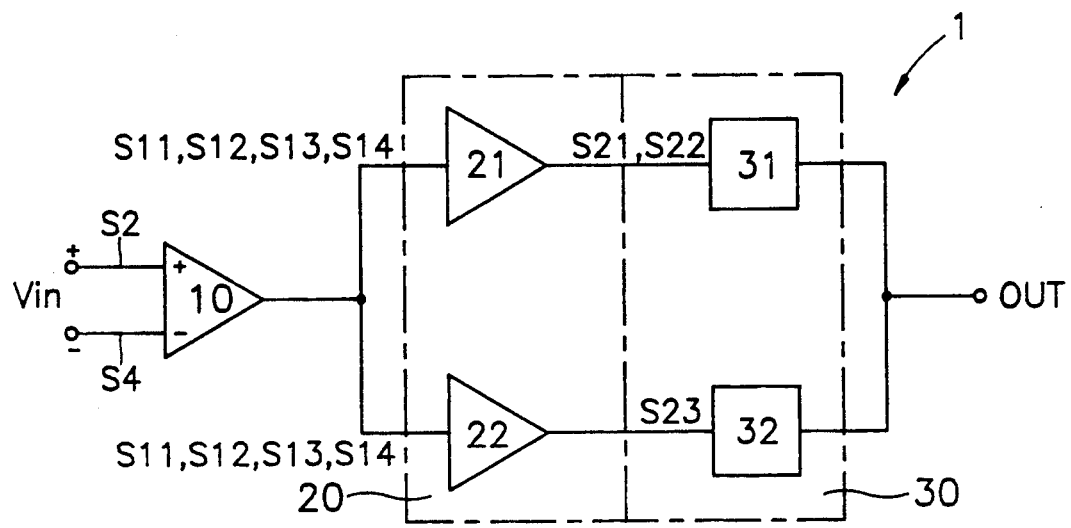
FIG. 2 is a block diagram showing the CMOS power amplifier of the present invention.
Figure 3:
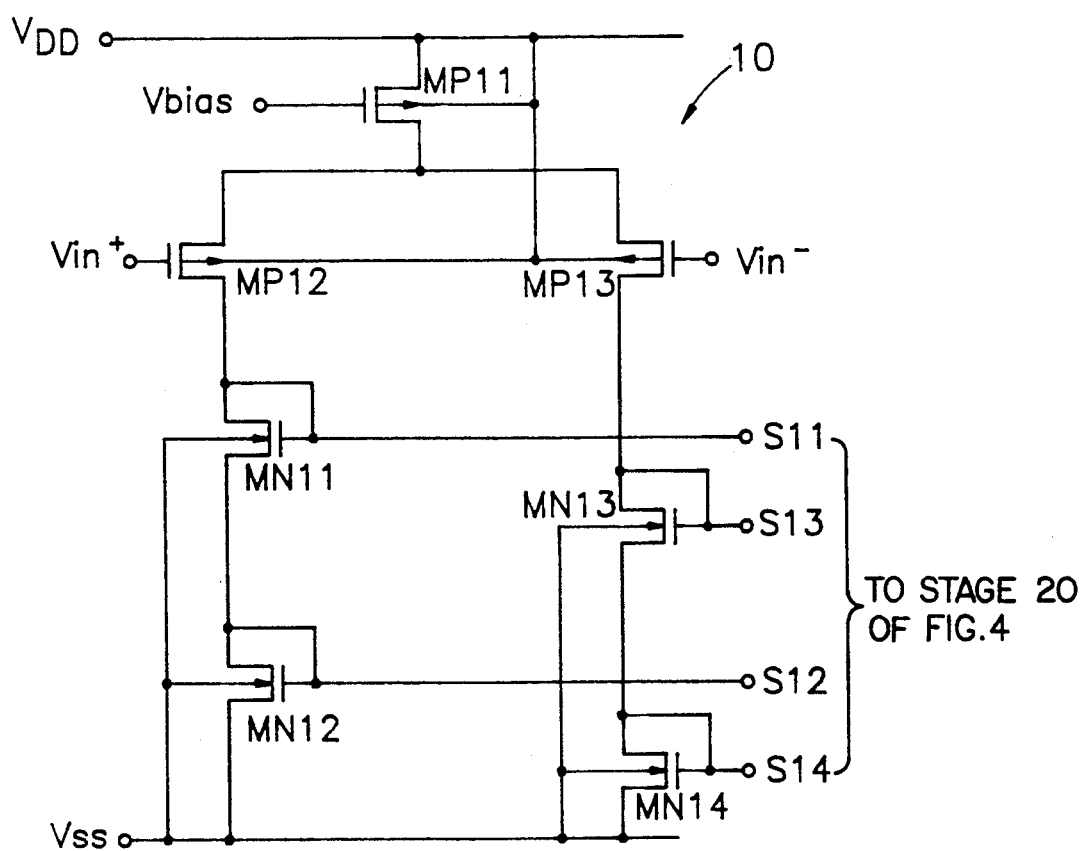
FIG. 3 is a schematic diagram illustrating the differential input amplifying stage of FIG. 2.
Figure 4:
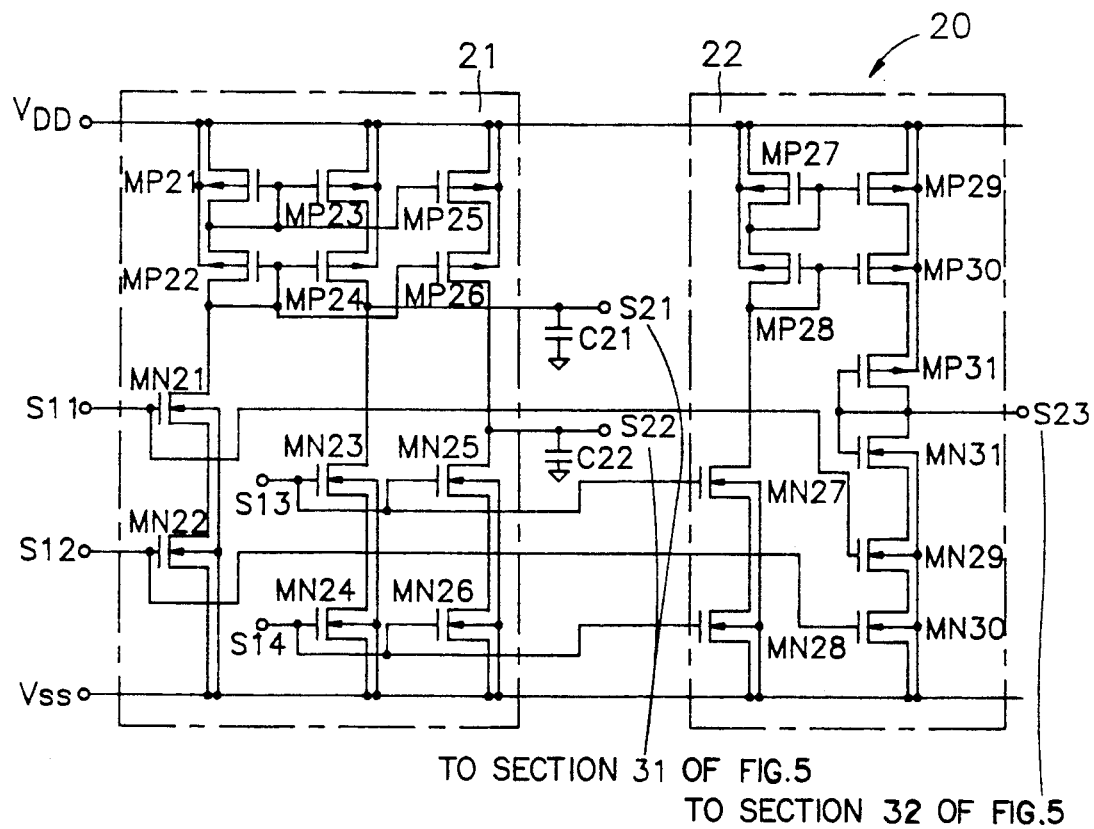
FIG. 4 is a schematic diagram illustrating the high-gain amplifying stage of the circuit of FIG. 2.
Figure 5:
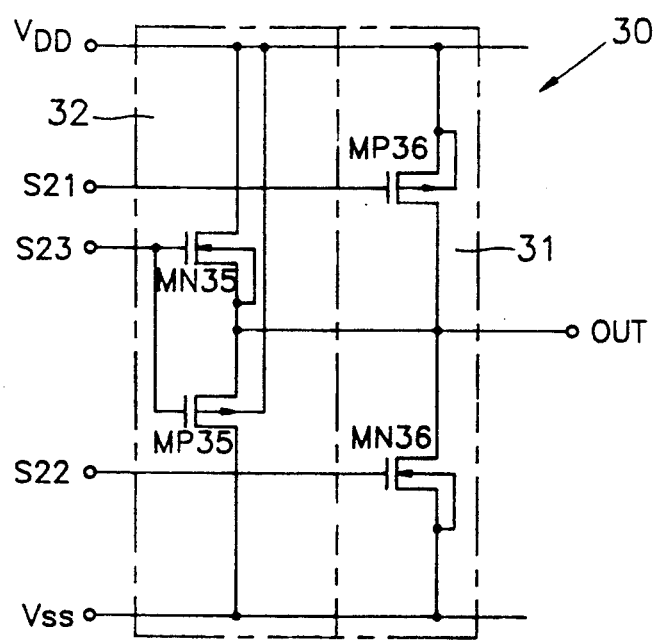
FIG. 5 is a schematic diagram illustrating the output stage of the circuit of FIG. 2.

FIGS. 3 to 5 respect in detail circuit components and connections of differential input amplifying stage 10, high-gain amplifying stage 20, and output stage 30 of FIG. 2. In each of FIGS. 3 to 5, transistors referenced with numerals beginning with the letters MP designate MOS P-type transistors. The letter combination MN in a reference numeral designates an N-type MOS transistor. Preferably, stages 10, 20, 30 are all fabricated in a single CMOS IC.

As is known in the art, the MOS transistors of the type disclosed herein include four terminals, namely, a gate, drain, source and substrate formed by superimposing layers of materials on a substrate of silicon. The gate is a control input and it affects the flow of electrical current between the drain and source; the drain and source may be viewed as two switched terminals.

In an N-type MOS transistor, if a high voltage or logic with respect to the substrate is applied to the gate, the source and drain are connected and the transistor operates as a closed switch. In a P-type MOS transistor, the switch is closed or on when a ground signal or 0 is applied to the gate. The switch is open or off when a high voltage or 1 with respect to the substrate is applied to the gate.

In a MOS transistor, current between the source and drain is modulated by a voltage applied to the gate. Three different operational modes or "regions" are possible.

In operation, a positive voltage (with respect to the substrate) is applied between the source and the drain. With zero gate bias (when the voltage between the gate and source is zero), almost no current flows between source and drain, which are effectively insulated. In practice, a very low source-to-drain leakage current exists. Thus, for gate voltage less than a threshold value, drain-to-source current is cut off, except for leakage current.

With positive gate bias, i.e. when the substrate-to-gate voltage exceeds the threshold and is greater than the drain voltage, drain-to-source current flows. The device operates in the unsaturated or linear region, in which the current flow is a function both of gate and drain voltages.

If the gate bias continues to increase, an inversion point is eventually reached at which full conduction occurs between gate and substrate. Physically, the semiconductor material separating the gate and substrate changes type, a phenomenon called inversion. The device then operates in a saturated state in which channel current is controlled by gate voltage level, independent of drain voltage.

Thus, electrically, a MOS device acts as a voltage controlled switch that conducts current between drain and source when the gate-to-source voltage exceeds the threshold voltage. The device can operate in three regions: a "cut-off" region in which the only current flow is source-to-drain leakage current; a "linear region" in which source-to-drain current increases linearly with gate voltage; and a "saturation" region in which inversion occurs and drain current is independent of drain voltage.

As is known in the art, connecting external components to the substrate is not necessary. All the P type MOSFETs have their substrate coupled to $V_{DD}$ and the N type MOSFETs have substrates coupled to $V_{SS}$. In some cases (e.g. MN35) substrate is coupled to source.

Referring now to FIG. 3, the differential input amplifying stage 10 includes a P-type MOS transistor MP11 with its gate receiving a bias voltage Vbias, and serving as a current source; a pair of differential transistors MP12, MP13 for respectively receiving inputs Vin+, Vin− on lines S2, S4; and two pairs of transistors MN13, MN14, MN11, MN12 forming current mirrors.

As is known in the art, one characteristic of all MOS transistors is transconductance, which expresses the relationship between output current and input voltage. Thus, transconductance is used to measure to the gain of a MOS device, and assumes a different value depending on whether the device is operating in the linear region, or the saturation region.

Also as is known in the art, MOSFETs shown in the figures can be coupled in so-called current mirror pairs. Drain current of a MOS transistor is related to the ratio of width (W) and length (L) of the semiconductor channel by which the transistor is formed.

A plurality of transistors can be formed on a single chip, each having the same (W/L) width to length ratio. All the transistors would have the same gate-to-source threshold voltage $V_T$ and could conduct the same drain-to-source current; such transistors are said to have the same "size."

Preferably, the most transistors in the invention are about equal to one another. However, preferably the sizes of FETs MN23, MN35, MP35 are smaller, and the size of MN25 is larger relatively.

The MOSFETs of the present invention do not operate in the switch mode but operate as an amplifier. Therefore, if a certain external input signal Vin+ and Vin− is provided, all of the MOSFETs are turned on. However, the MP36 or MN36 can be turned off according to whether the input is zero or above or below an operating threshold voltage $O_{op}$.

Current mirror transistor pairs are used in the invention. In order to construct a stable differential amplifier, a stable current source is required. If the characteristics of two transistors $Q_1$, $Q_2$ are the same, they can be constructed with the same operating currents $I_0 = I_8$. The effect of $I_0 = I_B$ is called a current mirror effect, and $Q_1$, $Q_2$ transistors are called Current Mirror Transistors. The effect is shown in the following equations:

$$I_B = I_{B1} + I_{B2} + h_{FE2} I_{B2}$$

$$I_O = h_{FE1} I_{B1}$$

$Q_1$, $Q_2$ transistors characteristics are the same, and so $$I_{B1} = I_{B2}, \; h_{FE2} = h_{FE1}$$

$$I_B = I_{B1} + I_{B1} h_{FE1} I_{B1} = 2I_{B1} + h_{FE1} I_{B1} = (2 + h_{FE1}) I_{B1}$$

generally, $h_{FE1} >> 2$, and so $$I_B = h_{FE1} I_{B1}$$

$$I_B = I_O$$

In amplifying stage 10, two differential input signals Vin+, Vin−, which are applied to the input terminals S2, S4, are amplified by transconductance of the two pairs of the current mirror transistors MN11, MN12, and MN13, MN14 and by the pair of the differential transistors MP12, MP13, and then the amplified signals are outputted through the drains of the current mirror transistors MN11-MN14 on lines S11-S14.

Under this condition, the amplified output signals S11-S14 (output through the drains of transistors MN11-MN14) are supplied to the high-gain amplifying stage 20, discussed below.

The differential input amplifying stage 10 can be designed differently, depending on the magnitude of a common mode range (CMR). The magnitude of the common mode range CMR is determined by the particular end application in which the power amplifier 1 is used. The differential input amplifying stage 10 according to the present invention is preferably constructed with a large CMR, preferably in the range −3.7 v to +4.0 v.

Referring now to FIG. 4, the high-gain amplifying stage 20 of amplifier 1 includes: a first amplifying section 21; a second amplifying section 22; and AC compensating capacitors C21, C22 for achieving AC stabilization. The first amplifying section 21 includes: pairs of transistors MP21, MP22, MP23, MP24, MP25, MP26 forming current mirrors with the differential input amplifying stage 10; and pairs of transistors MN21, MN22, MN23, MN24, MN25, MN26 for performing amplifications by receiving through their gates the signals S11, S12, S13, S14 from the differential input amplifying stage 10. Outputs S21, S22 of section 21 are emitted from each drain of the transistors MN23, MN25.

The second amplifying section 22 includes: pairs of current mirror transistors MP27, MP28, MP29, MP30; pairs of transistors MN29, MN30, MN27, MN28 for performing amplifications by receiving through their gates signals S11 to S14; and a pair of transistors MP31, MN31 which emit an output signal S23 of section 22 through their drains. AC compensating capacitors C21, C22 are connected to the drains of the transistors MN23, MN25, respectively.

Referring now to FIG. 5, output stage 30 of amplifier 1 includes: a first output section 31 consisting of a pair of transistors MP36, MN36 receiving through their gates output signals S21, S22 from first amplifying section 21 of high-gain amplifying stage 20. Transistors MP36, MN36 serve as a class B push-pull amplifier. Stage 30 includes a second output section consisting of a pair of transistors MP35, MN35 receiving through their gates output signal S23 of second amplifying section 22 of the high-gain amplifying stage 20, and serving as a class AB push-pull amplifier, with output OUT being outputted through the respective drains of transistors MP36, MN36.

In operation, when output voltage signals OUT of stage 30 are reduced in value, transistors MP36, MN36 of first output section 31 are kept in a turned-off state, and current is supplied to the load (not shown) by transistors MP35, MN35 of the second output section 32. Thus, when output OUT is reduced, a smaller current is supplied to the load, and therefore, transistors MP35, MN35 may be constructed with low power ratings.

When output voltage OUT increases, the transistors MP36, MN36 of the first output stage 31 are switched from the turned-off state to an on state, and current is supplied to the load by transistors MP35, MN35, MP36, MN36. As a result, in contrast to the case where the output is varied to a smaller magnitude, when the output is varied to a larger magnitude, a large current is supplied to the load, and most current is supplied by the transistors MP36, MN36 of the second output section 32. That is, when the output is varied to a larger magnitude, if the output rises over a threshold operating point, current is supplied to the load by transistors MP35, MP36. Meanwhile, if the output becomes smaller, current is supplied to the load by transistors MN35, MN36. Under these conditions, most of the current is supplied by the transistors MP36, MN36 of the first output stage 31.

Figure 6:
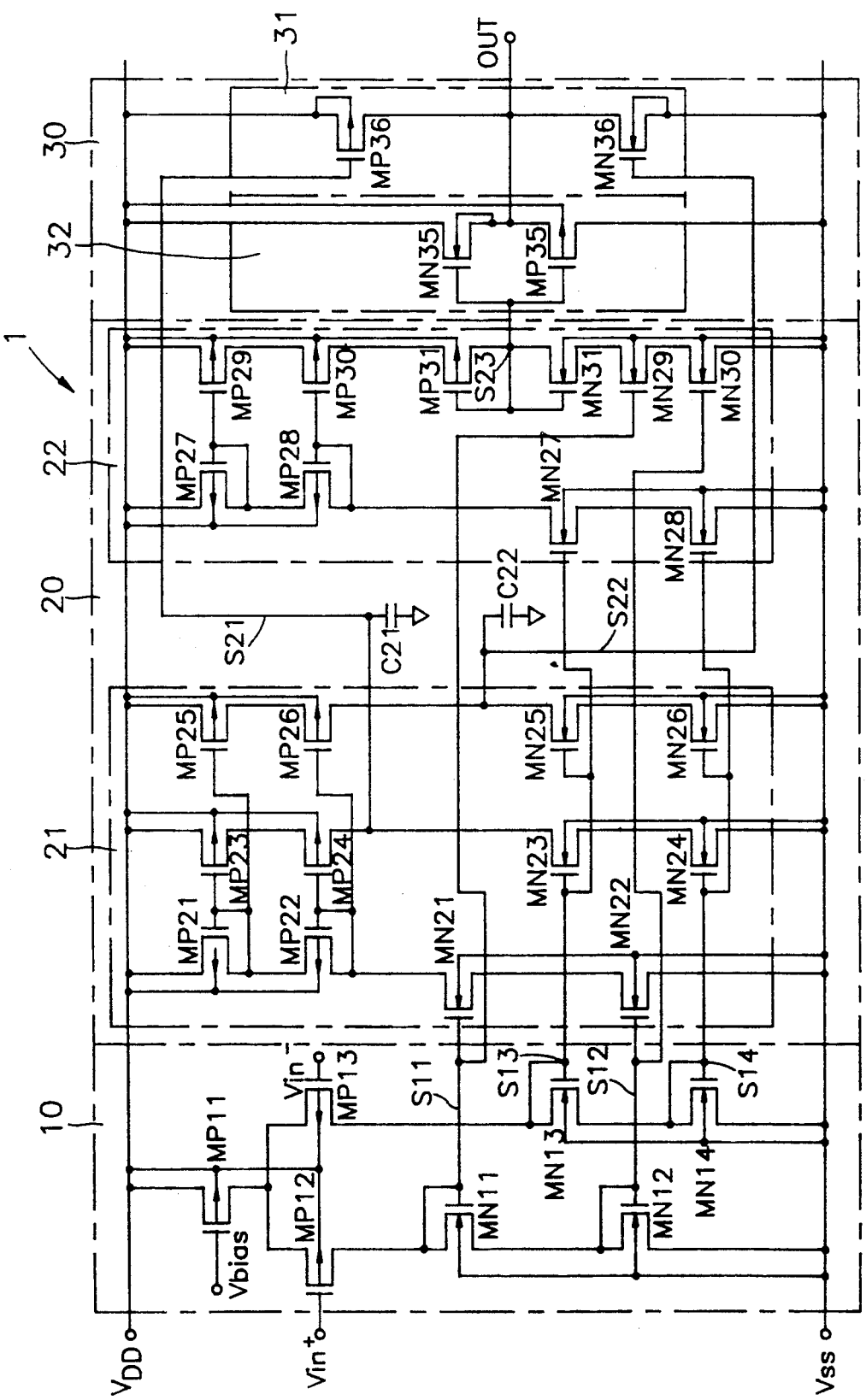
FIG. 6 is a schematic diagram illustrating the power amplifier of FIG. 2.

FIG. 6 is a detailed circuit diagram of an alternate power amplifier 1 according to the present invention. In this discussion, an ideal state is assumed in which equal voltage inputs Vin+, Vin− are supplied to the input terminals of transistors MP12, MP13 of the differential input amplifying stage 10. In such a case, the voltage levels supplied to the gates of the transistors MN21, MN23, MN25 are equal, and the levels of the voltages supplied to the gates of the transistors MN22, MN24, MN26 are also equal.

Accordingly, the voltage level of output S21 of first amplifying section 21 of the high-gain amplifying stage 20, i.e., the voltage of the drain of the transistor MN23, will have a DC operating point nearly equal to the power source voltage Vdd. Meanwhile, output S22 of the first amplifying section 21, i.e., the voltage of the drain of the transistor MN25, will have a DC operating point nearly equal to the power source voltage Vss. Consequently, transistors MP36, MN36 of output stage 30 are all turned off.

Here, if the sizes, electrical characteristics, and ratings of the current mirror transistors MP21, MP22, MP23, MP24 are equal, and if the sizes and characteristics of the transistors MN21, MN22, MN24 are equal, but if the size of the transistor MN23 is smaller than that of the transistor MN21, then transistors MP23, MP24 operate in an unsaturated region, causing the voltage of the drain of the transistor MN23 to approach a level nearly equal to the power source voltage VDD.

In the same way, if transistors MP21, MP22, MP25, MP26 are all identical devices, and if transistors MN21, MN22, MN26 are identical devices, transistor MN25 is larger or rated higher than that of the transistor MN21, then the transistors MN25, MN26 operate in an unsaturated region, with the result that the voltage of the drain of transistor MN25 comes to have a value nearly equal to the power source voltage $V_{ss}$. Accordingly, the values of the DC operating point currents of the transistors MP36, MN36 of the output stage 30 become zero.

Meanwhile, when input Vin+ is larger than input Vin− by more than a certain voltage value designated Oop, then the transistor MP24 operates in a saturated region, and transistors MP21-MP24, MN21-MN24 serve as a high-gain amplifying stage. Consequently, the drain voltage of the transistor MN23, i.e., the output signal S21 of the first amplifying stage 21, is shifted to a lower voltage defined by the formula (Vin+ −Vin−− −$O_{op}$)×(gain of differential input amplifying stage 10)×(gain of high-gain amplifying stage).

Under this condition, the transistor MN25 remains unsaturated, and therefore, drain voltage of the transistor MN25, i.e., the output signal S22 of amplifying stage 20, is maintained at a voltage nearly equal to the power source voltage Vss.

Accordingly, if the input voltage difference (Vin+− −Vin−) of stage 10 exceeds a certain threshold voltage value ($O_{op}$), then the gate voltage of the transistor MP36 of the output stage 30 is shifted to a voltage value which represents a low operating voltage value. Therefore, current required to drive a low impedance load begins to be supplied by the transistor MP36, and the output signals OUT of the output stage 30 are increased. Under this condition, gate voltage of the transistor MN36 of the output stage 30 stays nearly equal to the power source voltage Vss, so that transistor MN36 remains in a turned-off state.

On the other hand, if the input voltage difference (Vin+ −Vin−) of the differential input amplifying stage 10 reaches over a certain voltage value designated $O_{op}$, transistor MP36 of output stage 30 stays in a turned-off state, and current required for driving a low-impedance load is supplied by transistor MN36, with the result that output signal OUT of stage 30 is decreased.

Under this condition, the voltage across the gates and sources of transistors MP36, MN36 is equivalent to the power source voltage, and therefore, transistors MP36, MN36 can be designed with a small size.

A detailed operational discussion follows:

When the inputs are equal, i.e. Vin+ −Vin− =0, and are supplied to the input terminals of the FETs MP12, MP13 of the differential input amplifying stage, then the magnitudes of the drain currents of the FETs MP12, MP13 are equal and the drain currents of the MN11, MN12, MN13, MN14 are also equal.

MN21 constitutes a current mirror with MN11, and MN22 constitutes a current mirror with MN12 so the drain currents of FETs MN21, MN22, MP21, MP22 equal the drain current of FET MN11 by the effect of the current mirror.

The size of FET MN23 is smaller than that of FETs MN21, MN22, MN24, and the magnitude of the drain currents of the FET MN23 is smaller than that of FET MN21. Accordingly, FETs MP23, MP24 (constituting a current mirror with FETs MP21, MP22) lie in an unsaturated region. In the unsaturated region, the value of the drain to source voltage $V_{DS}$ is small, and the voltage drop of the FETs, MP23, MP24, is small. Accordingly, the drain voltage of FET MN23 becomes almost equal to the power source voltage $V_{DD}$.

In such a manner, if the size of the FET MN25 is larger than that of the FETs MN21, MN22, MN24, the FETs MN25, MN26 are the unsaturated region. Therefore, the voltage drop of the FETs MN25, MN26 is small. Accordingly, the voltage of the drain of the FET MN25 becomes nearly equal to the power source voltage $V_{ss}$. Consequently, the FETs MP36, MN36 are turned off.

The magnitude of the drain current of FET MN31 is the same as that of MN11, because FETs MN29, MN30, MN27, MN28 of the 2nd amplifying section constitute current-mirrors with the FETs MN11, MN12, MN13, MN14 relatively. Therefore, the FETs MN35, MP35 lie in a saturation region.

When the value |Vin+ −Vin−| of the inputs is small, and is below $O_{op}$, which does not concern the operation of the FETs MP36, MN36, the first amplifying section operates as explained above. The 2nd amplifying section operates as a high gain amplifying section using FETs, MN35, MP35. If the output voltage of the 2nd amplifying section is shifted to a level higher than the operating voltage of the FETs MN35, MP35, output current for the load is supplied by the FET MN35.

In contrast, if the output voltage of the 2nd amplifying section is shifted to a level lower than the operation voltage of the FETs MN35, MP35, then the current for the load is supplied by the FET MP35. Thus, the 2nd amplifying section and the FETs MN35, MP35 operates as a class AB amplifier.

If the input Vin+ is larger than the input Vin− by more than voltage $O_{op}$, then the drain current of the FET MN11 increases, and is larger than that of the FET MN13, and by the effect of the current mirror, the drain current of the FET MN21 increases. Accordingly, the drain currents of MP21, MP22 also increase. Then the drain currents of the FETs MP21, MP22 (constituting a current mirror with the FETs MP21, MP22) also increase. Consequently, the FETs MP23, MP24 operate in the saturation region.

A conventional class B push-pull amplifier is not capable of easily controlling DC operating point current. In contrast to this, the class B push-pull amplifiers provided by transistors MP36, MN36 of output stage 30, and which are also provided by first amplifying section 21, are capable of maintaining the DC operating point current of the output stage 30 at zero all the time.

However, the present invention can cause increased crossover distortion. This problem is solved in the following manner. Transistors MP35, MN35 interconnect the second amplifying section 22 and second output section 32. These transistors MP35, MN35 of output stage 30 and the second amplifying section 22 of the high-gain amplifying stage 20 are designed to drive the load only when the voltage difference between the two inputs Vin+, Vin− is less than a certain voltage value Oop.

When inputs Vin+, Vin− to transistors MP12, MP13 are equal, transistors MP27-MP31 of second amplifying section 22 remain on a saturated region, with the result that a high-gain output is generated in proportion to the voltage difference between the two inputs Vin+, Vin−.

Output S23 of the second amplifying section 22 of high-gain amplifying stage 20, i.e., the drains of the transistors MP31, MN31, are connected to the gates of transistors MP35, MN35 of the output stage 30. Transistors MP35, MN35 remain in a saturated region when the two inputs Vin+, Vin− of amplifying stage 10 are equal in their magnitude. Therefore, when the voltage difference between inputs Vin+, Vin− of input stage 10 is less than a certain voltage value designated Oop, the output is shifted to a level higher than the operating voltage, and current for the load is supplied by the transistor MP35. In contrast, if the output is shifted to a level lower than the operating voltage, current for the load is supplied by transistor MN35.

Under this condition, transistors MP35, MN35 of output stage 30 supply current to the load until transistors MP36, MN36 begin to conduct, and therefore, transistors MP35, MN35 may be small size, i.e., have low power and other electrical characteristics.

Thus, crossover distortion generated from transistors MP36, MN36 of output stage 30 and first amplifying section 21 of high-gain amplifying stage 20 are redressed by transistors MP35, MN35 of output stage 30 and second amplifying section 22 of the high-gain amplifying stage 20.

The phase margin of the unit bandwidth becomes a factor for determination of the stability of the amplifier 1. If an amplifier 1, having a good AC stability, is to be designed, the phase margin should exceed 60° C. In consideration of the AC stability factor, the present invention provides the following arrangement. As indicated in FIGS. 4 and 6, AC compensating capacitors C21, C22 are connected to output terminals of the first and second amplifying sections 21, 22 of the high-gain amplifying stage 20.

Table 1 below lists empirically measured values of electrical properties of the CMOS power amplifier 1 according to the present invention, the measurements being carried out in a circuit simulation.

TABLE 1

| Electrical characteristics | Conditions | Measured values |
| --- | --- | --- |
| Input offset voltage | | ±10 mv |
| Unit gain bandwidth | Open circuit | 600 kHz |
| Power supply rejection ratio | 0–4 kHz | −70 dB |
| Opening gain | No load | 90 dB |
| Slew rate | | 1.5 V/us |
| Settling time | With load, Capacitor: 1000 p Resistance: 300 | 3 us/3 us |
| CMR | | +4 to −3.7 V |

In Table 1 above, the setting time was determined based on 0.1% of the final value of the output, and the positive settling time and the negative settling time are respectively indicated.

According to the present invention as described above, the DC operating point current is reduced, and an output voltage equal to supply voltage swing can be obtained even under a low-impedance load.

What is claimed is:

1. A CMOS power amplifier comprising:
    a differential input stage having a positive input, a negative input, and plural first output signals;
    a high-gain amplifying stage operatively coupled to the plural first output signals of the input stage, the high gain amplifying section, each generating second output signals, and the first and second amplifying sections comprising means for being selectively driven in response to the plural first output signals; and
    an output stage operatively connected to the second outputs.

2. The amplifier of claim 1, wherein the means for being selectively driven comprises means for responding to a voltage difference between the positive input and the negative input and, in response thereto, for driving the first amplifying section when the voltage difference exceeds a threshold value, and for driving the second amplifying section when the voltage difference is less than the threshold value.

3. The amplifier of claim 2, wherein the first amplifying section comprises first, second, and third pairs of current mirror transistors (MP21 to MP26) and first, second an third pairs (MN21 to MN26) of amplifier transistors, the amplifier transistors each including a gate operatively connected to one of the first plural output signals, the amplifier transistors providing a plurality of output signals of the second output signals.

4. The amplifier of claim 3, wherein the second amplifying section comprises two pairs of current mirror transistors (MP27 to MP30) and two pairs of amplifier transistors (MN27 to MN30), each including a gate connected to one of the first output signals and each including a drain for providing at least one of the second output signals.

5. The amplifier of claim 4, wherein the output stage includes:
    a first output section (31) including two transistors (MP36, MN36) each including a gate connected to one of the plurality of output signals of the second output signals of the first amplifying section, the first output section being configured as a class B push-pull amplifier; and
    a second output section comprising two transistors each having a gate connected to the at least one of the second output signals, the second output section configured as a class AB push-pull amplifier, the transistors of the first and second output sections, each including a drain producing an output stage output signal.

6. The amplifier of claim 5, wherein the two transistors of the first output section are adapted for responding to the output stage output signal and for switching off the first output section when the output stage output signal drops.

7. The amplifier of claim 6, wherein the two transistors of the second output section comprises a P-type transistor and an N-type transistor, and
    are adapted for responding to current in the output stage output signal exceeding an operating point current for enabling the P-type transistor to output a load current,
    for responding to the output stage output signal current dropping below the operating current for enabling the N-type transistor to output a load current,
    and for responding to a drop in the output stage output signal current for selectively providing output through the first output section or the second output section.

8. The amplifier of claim 7, wherein the two transistors of the first output section and the two transistors of the second output section are connected for responding to an increase in the output stage output signal current for providing output from both the first and second output sections.

9. The amplifier of claim 7, wherein the two transistors of the first output section comprise one P-type transistor and one N-type transistor, and
 are adapted for responding to the output stage output signal current exceeding an operating point current for enabling the P-type transistor to output a load current,
 and for responding to the output stage output signal current dropping below the operating current for enabling the N-type transistor to output a load current,
 and for responding to a drop in the output stage output signal current for providing output from the first and second output sections.

* * * * *

UNITED STATES PATENT AND TRADEMARK OFFICE
CERTIFICATE OF CORRECTION

PATENT NO.   : 5,177,450
DATED        : January 5, 1993
INVENTOR(S)  : Bangwon Lee; Ylsung Bae It is certified that error appears in the above-identified patent and that said Letters Patent is hereby corrected as shown below:

Column 2, line 5, after "drives" insert -- a second section of the output stage, if the voltage --.
Column 2, line 9, change "comprising" to -- consisting --.
Column 2, line 52, change "MNI" to -- MN1 --.

Column 3, line 37, change "respect" to -- respectively illustrate --.
Column 3, line 54, change "logic" to -- logical one --.

Column 4, line 45, after "measure" delete "to".
Column 4, line 60, before "most" insert -- sizes of --.

Column 5, line 7, change "$I_8$" to -- $I_B$ --.
Column 5, line 20, change "$I_B=I_{B1}+I_{B1}...$" to -- $I_B=I_{B1}+I_{B1}+...$ --.

Column 6, line 56, change "Vdd" to -- $V_{dd}$ --.
Column 6, line 59, change "Vss" to -- $V_{ss}$ --

Column 7, line 5, before "transistor" insert -- but if --.
Column 7, line 15, change "Oop" to -- $O_{op}$ --.
Column 7, line 27, change "Vss" to -- $V_{ss}$ --.
Column 7, line 38, change "Vss" to -- $V_{ss}$ --.

Column 8, line 17, change "relatively" to -- respectively --.
Column 8, line 60, change "Oop" to -- $O_{op}$ --.

UNITED STATES PATENT AND TRADEMARK OFFICE
CERTIFICATE OF CORRECTION

PATENT NO. : 5,177,450

DATED : January 5, 1993

INVENTOR(S) : Bangwon Lee; Ylsung Bae

It is certified that error appears in the above-identified patent and that said Letters Patent is hereby corrected as shown below:

Column 9, line 6, change "Oop" to -- $O_{op}$ --.
Column 9, line 15, before "small" insert -- a --.
Column 9, line 52, change "setting" to -- settling --.

In the Claims:

Column 9, line 66, after "amplifying" insert -- stage having a first amplifying section, and a second --.

Column 10, line 49, change "comprises" to -- comprise --.

Signed and Sealed this

Sixteenth Day of November, 1993

Attest:

BRUCE LEHMAN

*Attesting Officer*   *Commissioner of Patents and Trademarks*